United States Patent
Patel et al.

(10) Patent No.: US 11,822,723 B2
(45) Date of Patent: Nov. 21, 2023

(54) INTERACTION ELEMENT, CONTROL ELEMENT AND MOTOR VEHICLE

(71) Applicant: MOTHERSON INNOVATIONS COMPANY LIMITED, London (GB)

(72) Inventors: Mukesh Patel, Stuttgart (DE); Thomas Agung Nugraha, Stuttgart (DE)

(73) Assignee: Motherson Innovations Company Limited, London (GB)

( * ) Notice: Subject to any disclaimer, the term of this patent is extended or adjusted under 35 U.S.C. 154(b) by 0 days.

(21) Appl. No.: 17/420,897

(22) PCT Filed: Jan. 6, 2020

(86) PCT No.: PCT/EP2020/050140
§ 371 (c)(1),
(2) Date: Jul. 6, 2021

(87) PCT Pub. No.: WO2020/144138
PCT Pub. Date: Jul. 16, 2020

(65) Prior Publication Data
US 2022/0066560 A1    Mar. 3, 2022

(30) Foreign Application Priority Data

Jan. 11, 2019 (DE) .................... 10 2019 100 657.0

(51) Int. Cl.
*G06F 3/01*    (2006.01)
*G06F 3/044*    (2006.01)
(Continued)

(52) U.S. Cl.
CPC .............. *G06F 3/016* (2013.01); *B60K 35/00* (2013.01); *G06F 3/0412* (2013.01);
(Continued)

(58) Field of Classification Search
CPC ...... G06F 3/016; G06F 3/0412; G06F 3/0445; B60K 35/00; B60K 2370/158
See application file for complete search history.

(56) References Cited

U.S. PATENT DOCUMENTS 9,063,610 B2    1/2015 Kim
2010/0053861 A1*  3/2010 Kim .................. H04M 1/22
                                                 250/206

(Continued)

FOREIGN PATENT DOCUMENTS

EP    2 778 855 A2    9/2014
EP    2 889 727 A1    7/2015

OTHER PUBLICATIONS

International Search Report dated Apr. 28, 2020 of International application No. PCT/EP2020/050140 (8 pages).
(Continued)

*Primary Examiner* — Andrea C Leggett
(74) *Attorney, Agent, or Firm* — Jones Day

(57) ABSTRACT

An interaction element is configured to receive touch or gesture inputs or provide tactile feedback outputs. A control element is configured to control the operation of at least one function of at least one device including at least one or more such interaction elements. A motor vehicle includes at least one or more such interaction elements or at least one or more such control elements.

18 Claims, 13 Drawing Sheets

(51) Int. Cl.
*B60K 35/00* (2006.01)
*G06F 3/041* (2006.01)
*G06F 3/0488* (2022.01)

(52) U.S. Cl.
CPC .......... *G06F 3/0445* (2019.05); *G06F 3/0488* (2013.01); *B60K 2370/1434* (2019.05); *B60K 2370/158* (2019.05); *B60K 2370/336* (2019.05)

(56) References Cited

U.S. PATENT DOCUMENTS

| | | | | |
|---|---|---|---|---|
| 2013/0106765 A1* | 5/2013 | Beecher | ................ | G06F 3/0445 345/173 |
| 2015/0185848 A1* | 7/2015 | Levesque | ............ | G06F 3/03547 345/173 |
| 2022/0043397 A1* | 2/2022 | Ely | ...................... | G04G 21/025 |

OTHER PUBLICATIONS

Written Opinion dated Apr. 28, 2020 of International application No. PCT/EP2020/050140 (22 pages).

* cited by examiner (State of the art)

(State of the art)

INTERACTION ELEMENT, CONTROL ELEMENT AND MOTOR VEHICLE

CROSS-REFERENCE TO RELATED APPLICATIONS

This application is a National Stage Entry of International Patent Application No. PCT/EP2020/050140, filed Jan. 6, 2020, which claims the benefit of foreign priority to German Patent Application No. DE 10 2019 100 657.0, filed Jan. 11, 2019, each of which is hereby incorporated by reference herein in its entirety for all purposes.

BACKGROUND

1. Field of the Invention

The present invention relates to an interaction element, for receiving touch and/or gesture events inputs and/or providing tactile feedback outputs. The invention also relates to a control element, for controlling the operation of at least one function of at least one device, comprising at least one or more such interaction elements. Further, the invention also relates to a motor vehicle comprising at least one or more such interaction elements and/or at least one or more such control elements.

2. Related Art

In today's vehicles a large number of different user input devices such as buttons are present for receiving inputs for controlling different functions of different devices of the vehicle. However, in the current design of respective buttons the number of input levels which one button can provide is limited and in addition mechanical movement of the button is required in case it needs to provide multiple levels of input. FIG. 1a shows a state of the art panel 1 which might be used for example at a door panel arm rest of a motor vehicle for window glass management. The panel 1 has an array of buttons 3 which are examples of such multiple level input buttons and a button 5 which is a press lock button. Each button 3 in FIG. 1a usually provides four levels of input, i.e. pull up (e.g. for window roll up), pull up two stages (e.g. for window automatic roll up), push down (e.g. for window roll down), push down two stages (e.g. for window automatic roll down). An illustration of an exemplary state of the art multiple level input button is shown in FIG. 1b in isolation. However, these kind of buttons are susceptible to wear and user experience might also be better. Further, they have dedicated functions and cannot be flexible used for other ones.

DE 10 2014 008 040 A1 discloses an interaction element for receiving touch and/or gesture events inputs and/or providing visual feedback outputs or tactile feedback outputs by vibration. The interaction element comprises at least one OLED-Display, having at least one input area element adapted to receive touch and/or gesture event inputs issued by at least one finger when interacting with at least one part of at least one surface of the OLED-Display. Further, a depression is adapted to provide a visual feedback output.

DE 20 2017 101 606 U1 discloses a display device for receiving touch and/or gesture event inputs and/or providing tactile feedback outputs. The display device comprises a touch surface element having an input area element to receive touch event inputs. Further, at least one output area element provides a tactile feedback output.

Therefore, the invention aims at providing user input devices which allow to receive user inputs at multiple levels and which are at the same time easy and intuitive to operate, hence increasing the safety of the driver and providing a better user experience. In addition high flexibility with respect to the assignment of functions controlled by the user input devices is demanded.

SUMMARY

The invention solves the problem according to a first aspect by an interaction element, for receiving touch and/or gesture events inputs and/or providing tactile feedback outputs, comprising at least one touch surface element, the touch surface element having (a) at least one input area element at least adapted to receive touch and/or gesture events inputs issued by at least one finger when interacting with at least one part of at least one surface of the input area element and/or the touch surface element; and (b) at least one output area element at least adapted to provide a tactile feedback output to the finger when interacting with at least one part of at least one surface of the output area element and/or the touch surface element; wherein the at least one input area element and the at least one output area element are formed as one. The resulting interaction element therefore has at least one input area element and at least one output area element designed as one common element at least in certain areas and/or in sections.

At least one, preferably all, input area element(s) can, especially by means of the touch controller, interchangeably and/or simultaneously also be adapted to provide a tactile feedback to the finger when interacting with at least one part of at least one surface of the input area element and/or the touch surface element, especially by interchanging use of the first electrode(s) as second electrode(s).

In one embodiment the interaction element comprises a first plurality of input area elements, especially at least two, three, four, five, six, seven, eight, nine and/or ten input area elements, and a second plurality of output area elements, especially at least two, three, four, five, six, seven, eight, nine and/or ten output area elements, wherein preferably at least two neighboring input area elements, especially all of each two neighboring input area elements, are at least in certain areas and/or at least partly separated by each other by at least one of the second plurality of output area elements.

In one embodiment the input area element comprises at least one first surface layer element, especially the first surface layer element comprises and/or represents at least one insulator layer, at least one first electrode and/or at least one first substrate element, preferably comprising at least one glass substrate especially the first electrode is arranged directly or indirectly below the first surface layer element and/or the first substrate element is arranged directly or indirectly below the first electrode element, especially the respective elements are sandwich-like arranged, especially with the first electrode being arranged at least in certain areas and/or at least partly between the first surface layer element and the first substrate element, the first electrode is arranged directly or indirectly below the first surface layer element and/or the first substrate element is arranged directly or indirectly below the first electrode element.

In one embodiment the output area element comprises at least one second surface layer element, especially the second surface layer element comprises and/or represents at least one insulator layer, at least one second electrode and/or at least one second substrate element, especially the respective elements are sandwich-like arranged, especially with the second electrode being arranged at least in certain areas and/or at least partly between the second surface layer element and the second substrate element, the second electrode is arranged directly or indirectly below the second surface layer element and/or the second substrate element is arranged directly or indirectly below the second electrode element. The second substrate element may comprise at least one glass substrate.

In one embodiment the tactile feedback (a) represents a haptic pattern dependent on the gesture/touch event input or (b) comprises increasing the surface friction of at least one portion of at least one surface of the output area element, especially of the second surface layer element, when applying a voltage to at least one part of the output area element, especially to the second electrode.

In one embodiment the output area element comprises at least one ultrasonic actuator, especially a plurality of ultrasonic actuators, coupled to or being in operative connection to the second substrate element, the second electrode or the second surface layer element for building an air bearing layer adjacent to at least one portion of at least one surface of the output area element, especially of the second substrate element and/or second surface layer element, when the one or more ultrasonic actuator(s) is/are activated.

In one embodiment the first and/or second surface layer element comprises at least one conductor, preferably a plurality of conductors, preferably for capacitive coupling, especially the one or more conductor(s) are arranged at least in sections and/or at least partly (a) within the second surface layer element, (b) parallel to at least one surface, especially the top and/or bottom surface, of the second surface layer element and/or (c) parallel to each other.

In one embodiment (a) at least some of the first and/or second surface layer elements, preferably all of the first and/or second surface layer elements, are formed as one common surface layer element at least partly and/or at least in certain areas, (b) at least some of the first and/or second substrate elements, preferably all of the first and/or second substrate elements, are formed as one common substrate element at least partly and/or at least in certain areas and/or (c) at least some of the first and/or second electrodes, preferably all of the first and/or second electrodes, are formed as one common electrode, especially as at least one segmented electrode, at least partly and/or at least in certain areas.

In one embodiment the output area element, especially the second surface layer element, comprises and/or represents at least one edge, at least one bump, at least one protrusion, at least one recess and/or at least one detent, whereby especially the output area element, especially the second surface layer element, can be manufactured using a printing process, an injection molding process, a heat forming process and/or a grinding process. This mechanical haptics approach is taken if no surface haptics as specified before is used.

In one embodiment at least one, preferably all, output area element(s) can, especially by means of at least one touch controller, interchangeably and/or simultaneously also be adapted to receive touch and/or gesture events issued by at least one finger when interacting with at least one part of at least one surface of the output area element and/or the touch surface element, especially by interchanging use of the second electrode(s) as first electrode(s).

In one embodiment the interaction element further comprises at least one light guide, preferably for illuminating through the input area element(s) and/or output area element (s) from beneath, especially the light guide being arranged and/or extending at least in sections and/or in certain areas directly or indirectly below and/or parallel to the first and/or second electrode(s) and/or below and/or parallel to the first and/or second substrate element(s).

In one embodiment the interaction element further comprises (a) at least one light source, especially adapted for coupling light into the light guide, (b) at least one printed wire board, preferably the light source and/or at least one element of the group comprising first/second surface layer element, first/second electrode and first/second substrate element being mounted at least partly on the printed wire board, and/or (c) at least one tactile feedback device for generating a tactile feedback to the user interacting with the interaction element.

In one embodiment the interaction element, especially the touch surface element, is designed as a free form element, especially having at least in certain areas a curved surface and/or having at least one first area extending in at least one first plane and at least one second area extending in at least one second plane, preferably the second plane being angled with respect to the first plane.

In one embodiment the input area element is designed such that a touch state can be detected, especially such that at least a finger-on state can be distinguished from a finger-push state, preferably by means of evaluation of the capacitive change value of the input area element selected by a user during interaction of the user's finger and said input area element and/or by means of evaluation of the capacitive change value of input area elements adjacent and/or neighboring to the selected input area element during interaction of the user's finger and the selected input area element and the input area elements adjacent and/or neighboring to said input area element.

The invention solves the problem according to a second aspect by a control element, for controlling the operation of at least one function of at least one device, comprising at least one or more, especially different, interaction element(s) of the first aspect of the invention.

The invention solves the problem according to a third aspect by a motor vehicle comprising at least one or more, especially different, interaction element(s) of the first aspect of the invention and/or at least one or more, especially different, control element(s) of the second aspect of the invention.

It has, thus, been surprisingly found that by providing an interaction element comprising at least one touch surface element it becomes possible to overcome the restrictions coming along with the design of a conventional physical input device such as a button and to allow multiple levels of input, such as single tap, multiple tap, finger rest, short touch, long touch, swipe and the like, as well as multiple methods which are controlled by the interaction element using, respectively, the same area of touch of the touch surface element (i.e. using the same touch surface element). Especially, controlling different methods can be eased by the interaction element since there is no longer the need to hard wire the interaction element with a certain functionality but the functionality can be changed even on the fly.

The inventors have particularly found that the touch surface element allows to providing both, user input ability as well as tactile feedback output ability. In this respect it is possible to adapt certain areas of the touch surface element to receive touch and/or gesture events inputs issued by at least one finger when interacting with at least one part of at least one surface of the input area element and/or the touch surface element. And further to adapt certain areas (especially others than that of the touch input) of the touch surface element to provide a tactile feedback output to the finger when interacting with at least one part of at least one surface of the output area element and/or the touch surface element. Therefore, respective input area elements and output area elements are comprised by the touch surface element.

Hence, the touch surface element which is presented to the user (directly or indirectly, i.e. there can be also one or more additional layers on top of the touch surface element, if desired), may have one or more input areas and/or one or more output areas, the respective areas belonging to the respective input area elements and output area elements. For example, two neighboring input area elements are separated by each other by one output area element. This allows that the user "feels" with his finger a borderline between the output area elements when interacting with the interaction element.

The inventor have found that a user input can be received by using an input area element which evaluates basically the change of capacity by means of a first electrode which is provided below the first surface layer element of the input area element. The input area element might also comprise further elements such as a first substrate element.

The inventor have found that a tactile feedback can be preferably produced using the coulomb force, i.e. an electrostatic approach, also known as electro-adhesive. Therefore the output area element might function according to a first surface haptic approach as illustrated in FIG. 2a. This approach uses a surface layer element 7 (being especially an insulator layer) and an electrode 9, especially the surface layer element 7 being arranged above the electrode 9. Preferably the surface layer element (i.e. the insulator) is thin, especially less than 3 micrometer. This regularly is preferred to have sufficient coulomb force. If now a user touches the surface layer element 7 (i.e. the insulator), the finger 11 of the user becomes attracted due to the coulomb force once an electrostatic field is applied, e.g. by powering the electrode 9. In other words, the surface friction is increased due to the coulomb force when an electrostatic field is applied. This gives the effect of "stickiness" to the surface of a substrate element 13, e.g. a glass substrate, which might be provided below the electrode 9. All three elements might be designed as layers and arranged sandwich-like, with the electrode 9 arranged in the middle.

Often it is required that the electrostatic induction is very close with the (outer) surface. However, sometimes it is also required that the (outer) surface is of a certain thickness. In case the surface layer (e.g. the surface layer element) is thick, a solution has been found in that electrostatic coupling in multiple layers of conductive layers is present. In other words, there are integrated one or more conductors for capacitive coupling. This allows to increase thickness of the outer layer without affecting the feedback mechanism adversely. This will be described in more detail later with reference to FIG. 8 below.

The inventor have also found that a tactile feedback can be produced using ultrasonic, also known as electro-vibration. Therefore the output area element might function alternatively and/or in addition according to a second surface haptic approach as illustrated in FIG. 2b. For this approach the output area element comprises at least one (preferably more than one) ultrasonic actuator (not shown in FIG. 2b), coupled to or being in operative connection to a substrate element 15 and/or a surface layer element. Of course, there is only need for either the substrate element or the surface layer, but also both elements might be present. And there is no need for a electrode in order to function, although it might be advantageous in order to use the output element as input element as well. However, as the actuators are placed, e.g. around the substrate element 15/surface layer element, a reduced surface friction due to an "air bearing" layer 17 that is build up when ultrasonic vibration is activated is present. This gives the effect of "slipperiness" of the surface for a finger 19 touching the substrate element 15. For example 7 inches needs twenty actuators (hap2u).

Forming some or all elements of the input area elements and/or the output area elements as one common element (which might or might not be identical to the touch surface element) leads to an improved design since stability is increased, manufacturing costs are reduced and a clean design is achieved.

It is preferred that the type of an area element, i.e. input area element and output area element, can be interchanged electronically, i.e. without physical reconfiguration. This allows for an improved utilization of the interaction element since input and output areas can be arranged as required in the respective situation.

Providing preferably a light guide and/or a light source allows to illuminate the input/output areas from behind for improving security and convenience.

Separating at least two input area elements from each other by means of at least one output area element is preferred since the user can operate without looking to the input area elements directly. This increases safety. It is also possible to provide a permanent tactile feedback mechanism such as by means of bumps, protrusions, recesses, detents and the like. These mechanisms are not dependent on energization, hence, are even more fail-safe.

It has been further found that the components used for inputs and outputs such as the touch surface element can be used in conjunction with integrated displays or even on other surfaces such as wood, plastic, leather, chrome and the like, i.e. basically every surface can be prepared for being used as an input and/or output device. Particularly, such touch sensitive areas can be placed in three dimensions around several sides of a device or a button, which makes all of those surfaces ready to be used for user inputs and/or outputs. It has been particularly advantageously that the interaction element, especially the touch surface element, can be either placed as a separate layer underneath any surface or directly on-molded in the actual surface of an input device like a button. The outer contour of the interaction element's and/or the control element's surface might have textures or defined pattern for a natural 3D feeling.

The inventors have also realized that there are many ways for providing confirmation of an user input event to the user in form of a feedback. This feedback can be of provided in several forms: Surface vibration, taptic/haptic feedback to the contact surface, e.g. from an integrated feedback mechanism, acoustic confirmation, visual confirmation, e.g. with graphics or lighting, and the like.

Especially the interaction element could be designed as being invisible to the user upon activation. For example the outer surface of the interaction element can perform "hidden till lit" function until required to show presence of a user input area (i.e. a button) or a confirmation of an event. This way the interaction element can be hidden in a non-intrusive and aesthetic manner in a control element, hence in a motor vehicle.

It is particularly noted that the interaction element, and so the control element, does not require any mechanical movement of any external components for receiving inputs and providing outputs, i.e. feedbacks. In case there are any movements at all, especially due to one or more ultrasonic actuator(s), the moving parts are away from the user. This lead to a quite clean design and, hence, provide convenient operation.

Indeed, the design of such an interaction element allows the integration of the input and output functionality (along with the touch surface element) in one single element, especially in one single free form element. Consequently also the control element can be designed as a free form element. In both cases, preferably creation of any design shape and multi-directional cutting and in-molding manufacturing processes of circuit elements is possible.

Alternatively or in addition it can be stated that the proposed schemes makes it possible to give multiple levels of inputs, when the input components are arranged in required 3D positions. There is no need for mechanical movement of any external part to accomplish this task. Upon having availability to have selection method, the same input area can be used for different functions altogether also with multiple level of input possibilities. This creates opportunity to remove several exclusively dedicated buttons and bring their functionalities to a single button or array of buttons, resulting into cost saving as well as efforts in production and integration.

BRIEF DESCRIPTION OF THE DRAWINGS

The following drawings show aspects of the invention for improving the understanding of the invention in connection with some exemplary illustrations, wherein

FIG. 4b shows an illustration of a first instant of the gesture/touch event of FIG. 4a;

FIG. 4d is an illustration of a third instant of the gesture/touch event of FIG. 4a;

FIG. 5b shows an illustration of a first instant of the gesture/touch event of FIG. 5a;

FIG. 5d shows an illustration of a third instant of the gesture/touch event of FIG. 5a;

FIG. 7b shows an illustration of the different effective areas of the interaction element of FIG. 7a;

DETAILED DESCRIPTION

Figure 3:
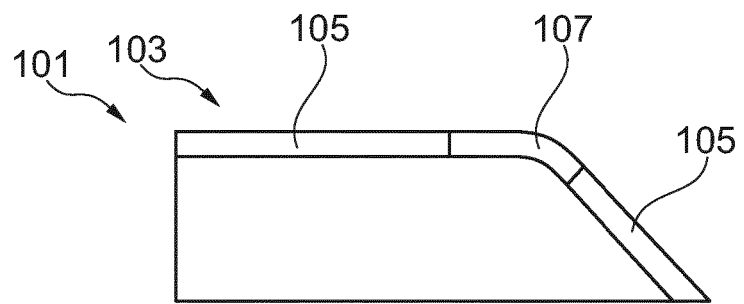
FIG. 3 shows an illustration of an interaction element according to the first aspect of the invention in a first embodiment.

FIG. 3 shows an illustration of an interaction element 101 according to the first aspect of the invention in a first embodiment. The interaction element 101 comprises a touch surface element 103. The touch surface element 103 has two input area elements 105 which are, respectively, adapted to receive touch and/or gesture events inputs issued by a finger when interacting with at least one part of at least one surface of the input area element 105. The touch surface element 103 has further one output area element 107 which is adapted to provide a tactile feedback output to the finger when interacting with at least one part of at least one surface of the output area element 107.

The input area elements 105 and output area element 107 are formed as one at least in certain areas, so that the haptic feedback area (i.e. output area element 107) is directly integrated in the touch surface element 103 along with the input area element 105. In other words, the interaction element 101 provides for an edge detection for rolling over multiple surfaces by using a touch sensor (i.e. interaction element 101) with an haptic/tactile feedback. In this embodiment the output area element 107 is an extended area as indicated by the dark area 107. In other embodiments the output area element might be established only by the edge between both input area elements 105 separated from each other by the edge as the output area element 107.

Of course, the shape of the interaction element 101 is just one example but every other shape might be possible as well.

Figure 4A:
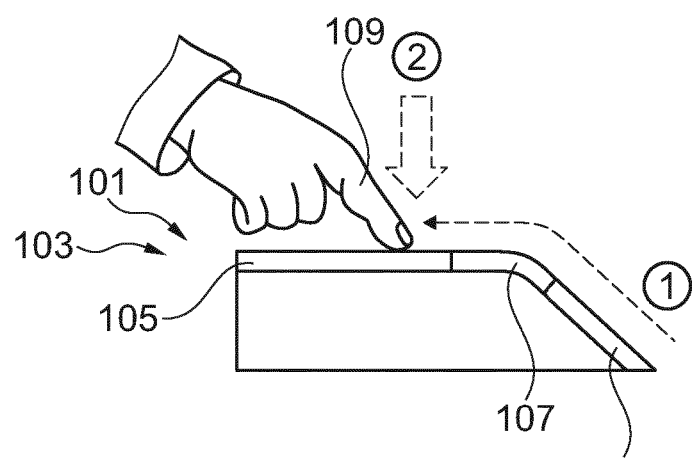
FIG. 4a shows an illustration of a first gesture/touch event as input to the interaction element of FIG. 3.
Figure 4B:
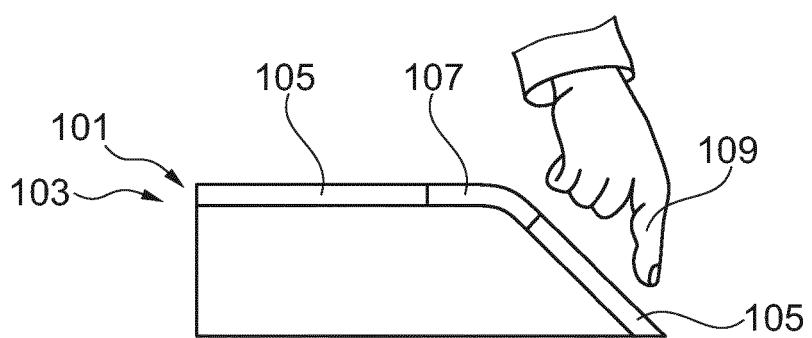
Figure 4C:
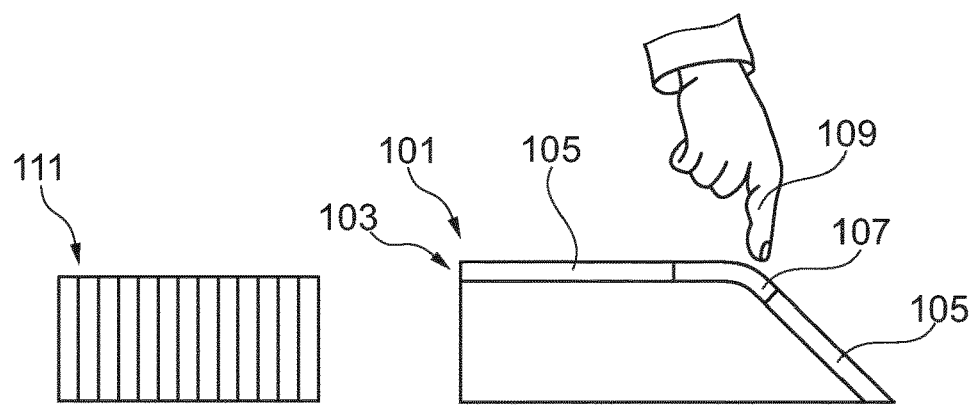
FIG. 4c shows an illustration of a second instant of the gesture/touch event of FIG. 4a along with a first haptic pattern.
Figure 4D:
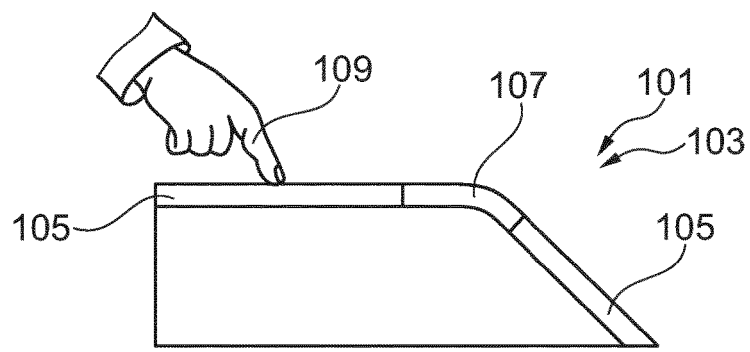

FIG. 4a shows an illustration of a first gesture/touch event as input to the interaction element 101 of FIG. 3, the gesture/touch event being a "slide up". A finger 109 swipes up for the purpose of issuing a "roll up" command of a window controller, as indicated by the dashed line in FIG. 4a which is indicated with a "1 in a circle". I.e. the finger swipes across the input area element 105 (as shown in FIG. 4b which shows an illustration of a first instant of the gesture/touch event of FIG. 4a), the output area element 107 (as shown in FIG. 4c which shows an illustration of a second instant of the gesture/touch event of FIG. 4a) and the other input area element 105 (as shown in FIG. 4d which shows an illustration of a third instant of the gesture/touch event of FIG. 4a). For the purpose of issuing an "automatic roll up" command of the window controller, firmly after swiping, the finger 109 is pushed as illustrated by the arrow indicated with a "2 in a circle" in FIG. 4a.

In FIG. 4c in addition a first haptic pattern 111 is shown which illustrates the haptic/tactile effect which the Finger 109 expires while moving along the edge designed as output area element 107. It feels like many, closely successive peaks. Of course, the haptic pattern 111 is only for the purpose of illustration and other haptic patterns might be possible as well.

Additionally or alternatively it is preferably possible: In course of the first instance of the gesture/touch event it might be possible to locate the area of first touch and/or to measure the distance to the haptic feedback area (i.e. the output area element 107). In course of the second instance of the gesture/touch event it might be possible to trace the direction of the slide and/or to enable the feedback pattern when finger crosses the haptic feedback area (i.e. the output area element 107). In addition also a lighting as a secondary confirmation might be activated. In course of the first instance of the gesture/touch event it might be possible to perform a function based on the gesture, especially once the finger 109 rests in the final area (i.e. the input area element 105).

Figure 5A:
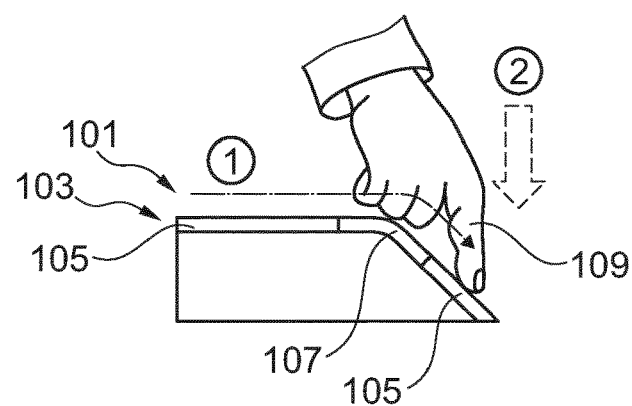
FIG. 5a shows an illustration of a second gesture/touch event as input to the interaction element of FIG. 3.
Figure 5B:
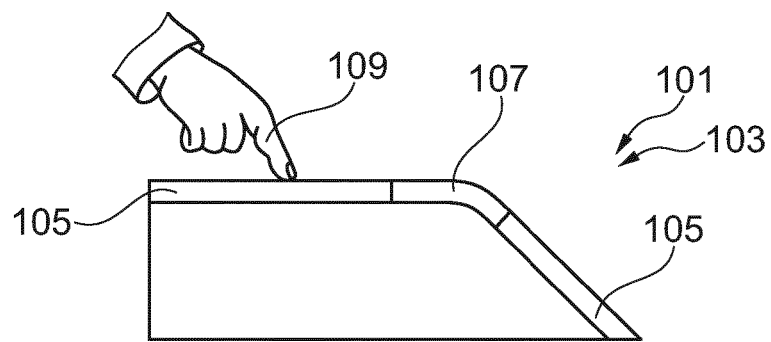
Figure 5C:
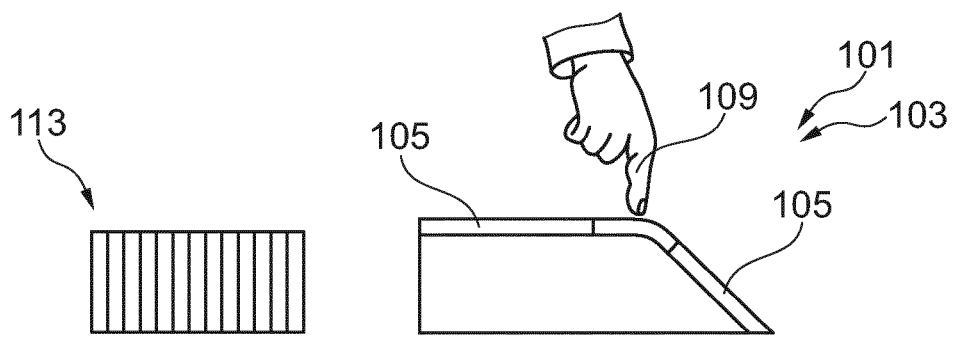
FIG. 5c shows an illustration of a second instant of the gesture/touch event of FIG. 5a along with a second haptic pattern.
Figure 5D:
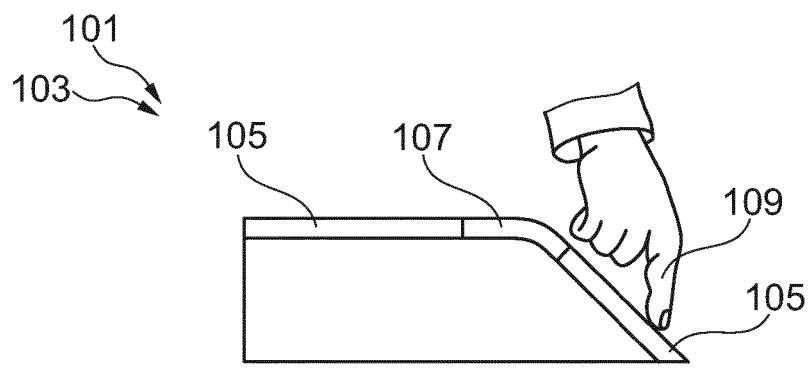

FIG. 5a shows an illustration of a second gesture/touch event as input to the interaction element 101 of FIG. 3, the gesture/touch event being a "slide down". The finger 109 swipes down for the purpose of issuing a "roll down" command of a window controller, as indicated by the dotted-dashed line in FIG. 5a which is indicated with a "1 in a circle". I.e. the finger swipes across the input area element 105 (as shown in FIG. 5b which shows an illustration of a first instant of the gesture/touch event of FIG. 5a), the output area element 107 (as shown in FIG. 5c which shows an illustration of a second instant of the gesture/touch event of FIG. 5a) and the other input area element 105 (as shown in FIG. 5d which shows an illustration of a third instant of the gesture/touch event of FIG. 5a). For the purpose of issuing a "automatic roll down" command of the window controller, firmly after swiping, the finger 109 is pushed as illustrated by the arrow indicated with a "2 in a circle" in FIG. 5a.

In FIG. 5c in addition a second haptic pattern 113 is shown which illustrates the haptic/tactile effect which the Finger 109 expires while moving along the edge designed as output area element 107. It feels like many, more distant (compared to the first haptic pattern 111) successive peaks.

Of course, the second haptic pattern 113 is only for the purpose of illustration and other haptic patterns might be possible as well.

Additionally or alternatively it is preferably possible: In course of the first instance of the gesture/touch event it might be possible to locate the area of first touch and/or to measure the distance to the haptic feedback area (i.e. the output area element 107). In course of the second instance of the gesture/touch event it might be possible to trace the direction of the slide and/or to enable the feedback pattern when finger crosses the haptic feedback area (i.e. the output area element 107). In addition also a lighting as a secondary confirmation might be activated. In course of the first instance of the gesture/touch event it might be possible to perform a function based on the gesture, especially once the finger 109 rests in the final area (i.e. the input area element 105).

The examples described by way of FIGS. 4a-d and FIGS. 5a-d demonstrate that different haptic patterns (e.g. first and second haptic patterns 111 and 113) can be used for different slide directions.

Especially it is emphasized that preferably no additional layer is required for the haptic feedback but both, the input area element(s) and the output area element(s), are formed as one. In other words the same touch surface element (e.g. touch sensor layer) can be used for input as well as output.

Figure 6A:
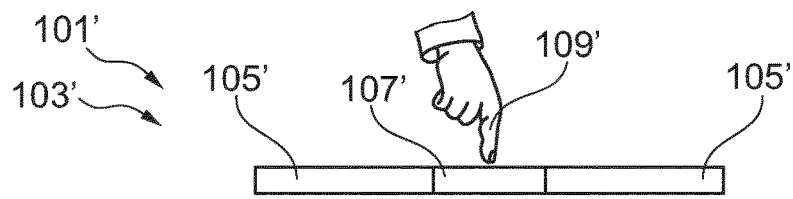
FIG. 6a shows an illustration of an interaction element according to the first aspect of the invention in a second embodiment.

FIG. 6a shows an illustration of an interaction element according to the first aspect of the invention in a second embodiment. Features which functionally correspond as far as possible to those of the first embodiment of interaction element 101 are provided with the same reference signs, however, single dashed. Since the functionality of the second embodiment of interaction element 101' largely corresponds to the first embodiment of the interaction element 101, only differences between the first and second embodiments are discussed below. And besides, the explanations given above apply for the second embodiment and the respective Figure accordingly.

Interaction element 101' has a flat design in contrast to the curved design of interaction element 101. In other words, the edge detection method is equally applicable on 3D as well as flat surfaces. There is no additional change in method due to change in geometry.

Figure 6B:
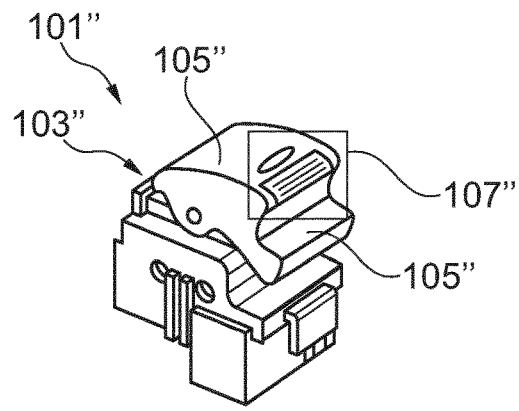
FIG. 6b shows an illustration of an interaction element according to the first aspect of the invention in a third embodiment.

FIG. 6b shows an illustration of an interaction element according to the first aspect of the invention in a third embodiment. Features which functionally correspond as far as possible to those of the first embodiment of interaction element 101 and second embodiment of interaction element 101' are provided with the same reference signs, however, doubled dashed. Since the functionality of the third embodiment of interaction element 101" largely corresponds to the first embodiment of the interaction element 101 and the second embodiment of the interaction element 101', only differences between the third and first and second embodiments are discussed below. And besides, the explanations given above apply for the third embodiment and the respective Figure accordingly.

Interaction element 101" has a free form design which is a more advanced design than that of interaction element 101 and interaction element 101'. Here, a natural feeling of edge detection is possible.

Figure 6C:
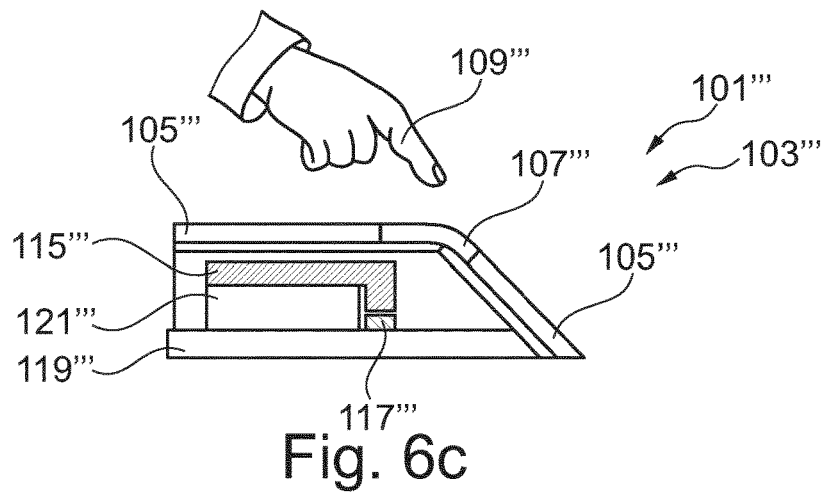
FIG. 6c shows an illustration of an interaction element according to the first aspect of the invention in a fourth embodiment.

FIG. 6c shows an illustration of an interaction element according to the first aspect of the invention in a fourth embodiment. Features which functionally correspond as far as possible to those of the first embodiment of interaction element 101, the second embodiment of interaction element 101' and the third embodiment of interaction element 101" are provided with the same reference signs, however, triple dashed. Since the functionality of the fourth embodiment of interaction element 101''' largely corresponds to the first embodiment of the interaction element 101, the second embodiment of the interaction element 101' and the third embodiment of interaction element 101'', only differences between the fourth and first, second and third embodiments are discussed below. And besides, the explanations given above apply for the fourth embodiment and the respective Figure accordingly.

Interaction element 101''' is especially similar to interaction element 101. However, interaction element 101''' further comprises a light guide 115''', for illuminating through the input area elements 105''' and output area element 107''' from beneath. The interaction element 101''' further comprises a light source 117''' adapted for coupling light into the light guide 115', optionally at least one printed wire board 119', the light source 117''' being mounted at least partly on the printed wire board 119''', and optionally a tactile feedback device 121''' for generating a tactile feedback to the user interacting with the interaction element 101'''. By means of the tactile feedback device 121''' a further feedback mechanism is provided in addition to the output area element 107'''. The tactile feedback device 121''' for example might provide feedback for prompting the success or failure of some operational command after completion of the touch/gesture input of the user.

Figure 7A:
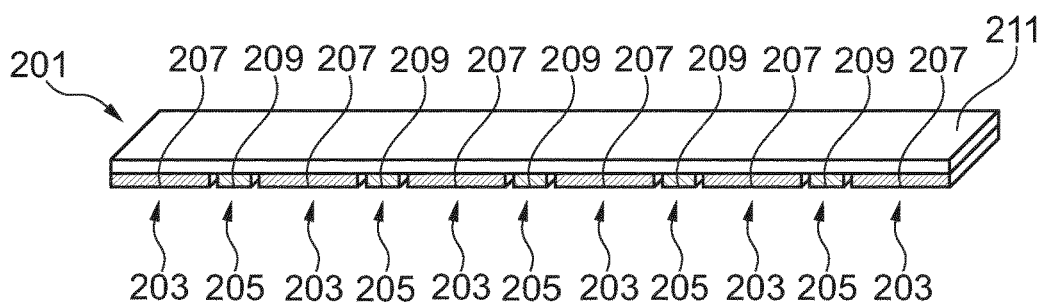
FIG. 7a shows an illustration of an interaction element according to the first aspect of the invention in a fifth embodiment.

FIG. 7a shows an illustration of an interaction element 201 according to the first aspect of the invention in a fifth embodiment. Insofar interaction element 201 has static borderlines, where the places of the borderlines are fixed and do not move. Interaction element 201 comprises a touch surface element having a first plurality (i.e. six) of input area elements 203 and a second plurality (i.e. five) of output area elements 205. Each input area element 203 comprises a first electrode 207 and each output area element 205 comprises a second electrode 209. The first electrodes 207 are for sensing (i.e. receiving touch/gesture inputs) and the second electrodes 209 are for providing tactile feedback outputs. Further, each input area element 203 and each output area element 207 comprise, respectively, a first and second surface layer element. All surface layer elements are formed as one common surface layer element 211. Hence, FIG. 7a shows more details of an interaction element than the previous Figures. In particular it becomes even more clear that the input area element 203 and the output area element 207 are formed as one in certain areas is to be understood here with respect to the first and second surface layer element which is presented as the common surface layer element 211.

Figure 7B:
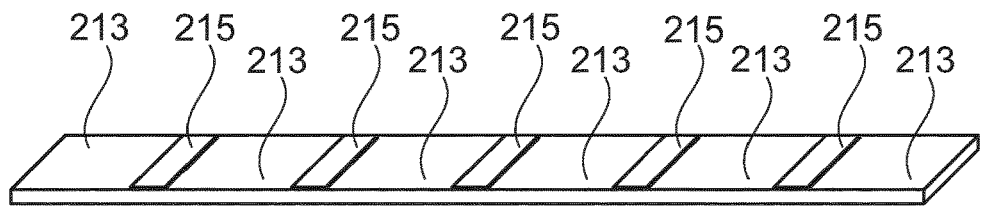

FIG. 7b shows an illustration of the different effective areas of the interaction element 200 of FIG. 7a, i.e. the presentation of the interaction element 201 from a user's view.

There are areas 213 working as touch buttons and there are areas 215 working as virtual borderline, i.e. providing tactile feedback. Areas 213 and areas 215 are alternating from left to right. In other words, each touch button 213 has a dedicated electrode 207 for touch sensing and each virtual borderline 215 (i.e. where the finger feels the borderline) has a dedicated electrode 209 to induce the electrostatic field.

However, since electrostatic induction needs to be very close with the surface, in case the surface layer element 211 is thick (e.g. more than three micron) it might be advantageous using an advanced approach.

Figure 8:
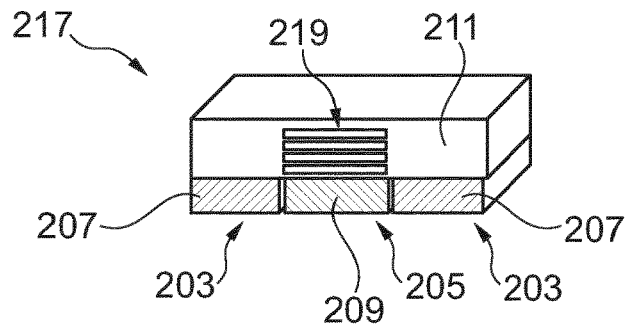
FIG. 8 shows an illustration of an interaction element according to the first aspect of the invention in a sixth embodiment.

FIG. 8 shows an illustration of an interaction element 217 according to the first aspect of the invention in a sixth embodiment. Essentially it is based on the interaction element 201 and develops it further, hence, features which functionally correspond as far as possible to those of the fifth embodiment of interaction element 201 are provided with the same reference signs.

However, in interaction element 217 the second surface layer element comprises a plurality of conductors 219 for capacitive coupling. The conductors 219 are arranged within the second surface layer element 211, parallel to the top surface of the second surface layer element 211 and parallel to each other. In other words, the solution approach is done by electrostatic coupling in multiple layers of conductive layers 219.

Figure 9A:
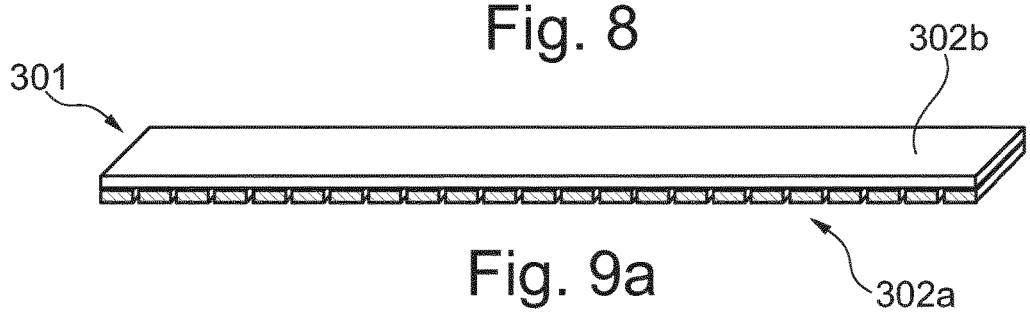
FIG. 9a shows an illustration of an interaction element according to the first aspect of the invention in an seventh embodiment.

FIG. 9a shows an illustration of an interaction element 301 according to the first aspect of the invention in a seventh embodiment. Insofar interaction element 301 represents dynamic borderlines, where the places of the borderlines may change dependent on external and/or internal conditions such as display content, physical location of the interaction element, history of touch/gesture events and/or history of commands issued by user inputs, and the like. Interaction element 301 comprises a segmented electrode 302a where input and output areas can be interchangeably controlled, especially by means of an touch controller. In other words, each electrode can be used as both, first electrode and second electrode, dependent on the configuration, hence, the distribution of input area elements and output area elements can be chosen nearly arbitrarily in interaction element 301. Also a common surface layer element 302b is present (see also description with respect to FIG. 7a and element 211 above for details which apply here mutatis mutandis, too), especially as part of the touch surface element.

Figure 9B:
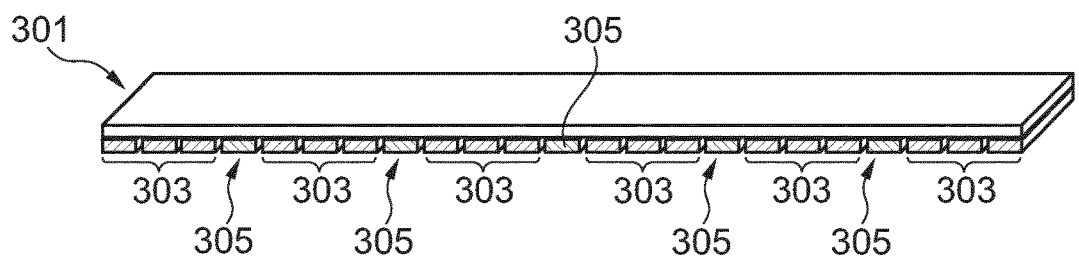
FIG. 9b shows an illustration of the interaction element of FIG. 9a in a first operation state.

FIG. 9b shows an illustration of the interaction element 301 of FIG. 9a in a first operation state. Here, interaction element 301 comprises a touch surface element having a first plurality (i.e. six) of input area elements 303 and a second plurality (i.e. five) of output area elements 305. Each input area element 303 comprises three electrodes working as first electrodes and each output area element 305 comprises one electrode working as second electrode.

Figure 9C:
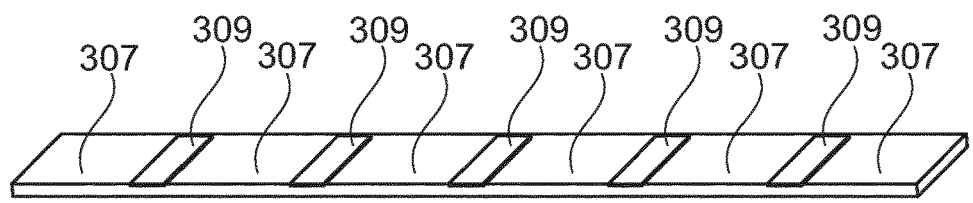
FIG. 9c shows an illustration of the different effective areas of the interaction element of FIG. 9b.

FIG. 9c shows an illustration of the different effective areas of the interaction element 301 of FIG. 9b, i.e. the presentation of the interaction element 301 from a user's view.

There are areas 307 working as touch buttons and there are areas 309 working as virtual borderline, i.e. providing tactile feedback. Areas 307 and areas 309 are alternating from left to right.

Consequently, during the final operation the interaction element 201 with static borderlines is quite similar to the interaction element 301 in the first operation state. However, the number of electrodes may vary. Nevertheless, to a wide extend the explanations given above with respect to interaction element 201 apply mutatis mutandis also to the interaction element 301 in the first operation state.

Figure 9D:
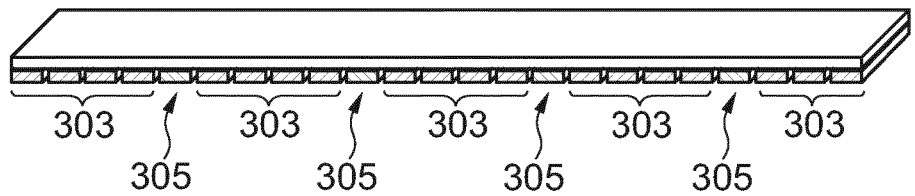
FIG. 9d shows an illustration of the interaction element of FIG. 9a in a second operation state.

FIG. 9d shows an illustration of the interaction element 301 of FIG. 9a in a second operation state. Here, interaction element 301 comprises a first plurality (i.e. five) of input area elements 303 and a second plurality (i.e. four) of output area elements 305. Each input area element 303 comprises four or three electrodes working as first electrodes and each output area element 305 comprises one electrode working as second electrode.

Figure 9E:
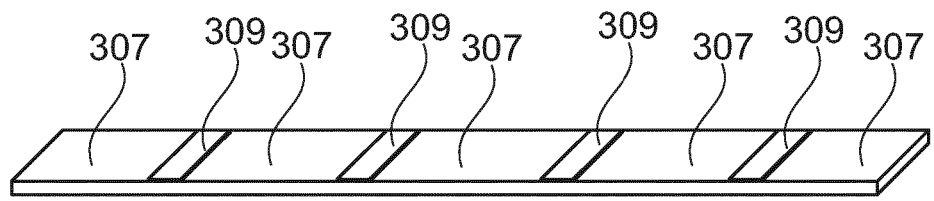
FIG. 9e shows an illustration of the different effective areas of the interaction element of FIG. 9d.

FIG. 9e shows an illustration of the different effective areas of the interaction element 301 of FIG. 9d, i.e. the presentation of the interaction element 301 from a user's view. The explanations given above with respect to FIG. 9c apply here mutatis mutandis, too, and must, therefore, not being repeated here.

Consequently, the number of buttons and borderlines and their locations and extensions are might be controlled in a quite efficient and easy way.

Figure 10:
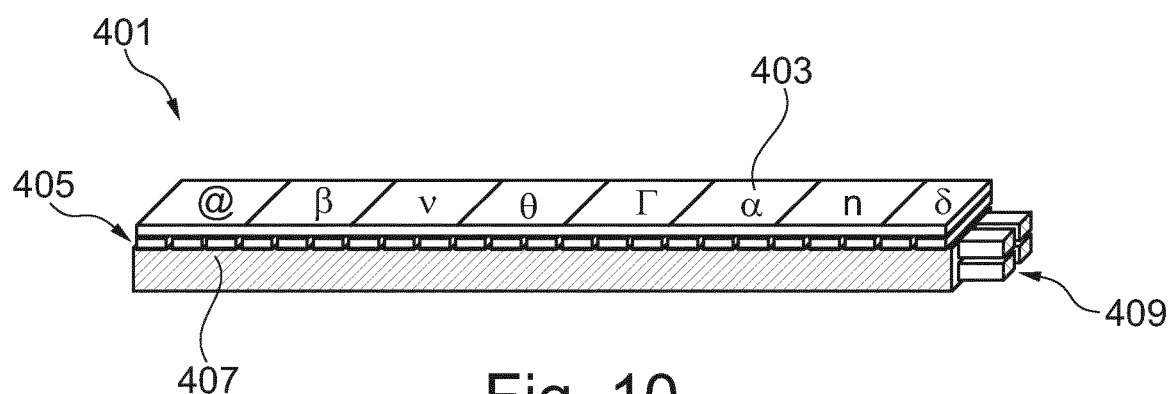
FIG. 10 shows an illustration of an interaction element according to the first aspect of the invention in an eighth embodiment.

FIG. 10 shows an illustration of an interaction element 401 according to the first aspect of the invention in an eighth embodiment. The interaction element 401 comprises a touch surface element having a common surface layer element 403 and a plurality of first and second electrodes 405 arranged below the surface layer element 403, hence, realizing respective input area elements and output area elements. Especially, the electrodes are realized as transparent conductives. In addition, interaction element 401 comprises a light guide 407 and a light source 409 which couples light into the light guide 407. The lighting segment approach may be taken to improve sensory feedback on top of haptics feedback of the respective button (i.e. output area element).

Figure 11A:
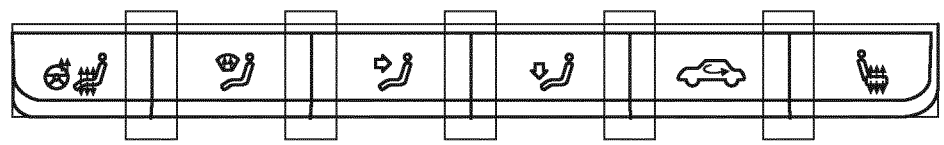
FIG. 11a, b, c shows different realizations of an interaction element according to the first aspect of the invention.
Figure 11B:
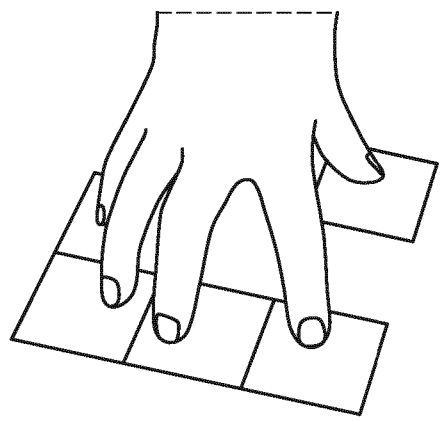
Figure 11C:
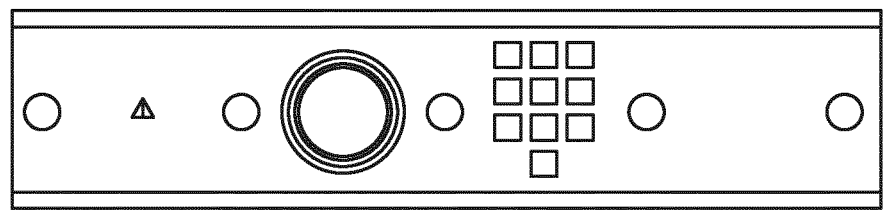

FIGS. 11a-c show further different realizations of an interaction element according to the first aspect of the invention. Especially it can be taken from the examples that lighting segment approach may be taken to improve sensory feedback on top of haptics feedback of the respective button (i.e. output area element). In FIG. 11a the output area elements are highlighted by rectangles. FIGS. 11b and 11c illustrate by way of example the possibility to design the input/output elements free-form like. All the realizations have in common that they are designed as one with respect to a common surface, i.e. for example with respect to the first and/or second surface layer elements.

Figure 12A:
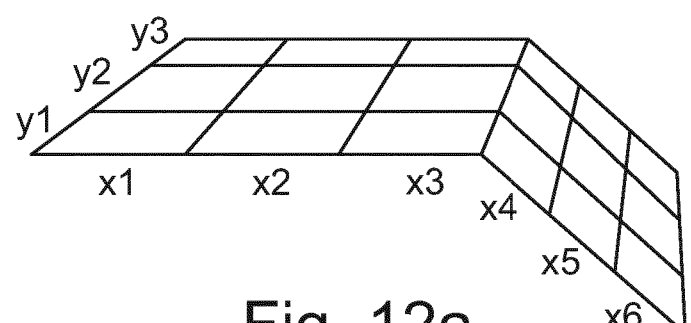
FIGS. 12a, 12b, 12c shows an illustration of a sensor matrix and detection states.
Figure 12B:
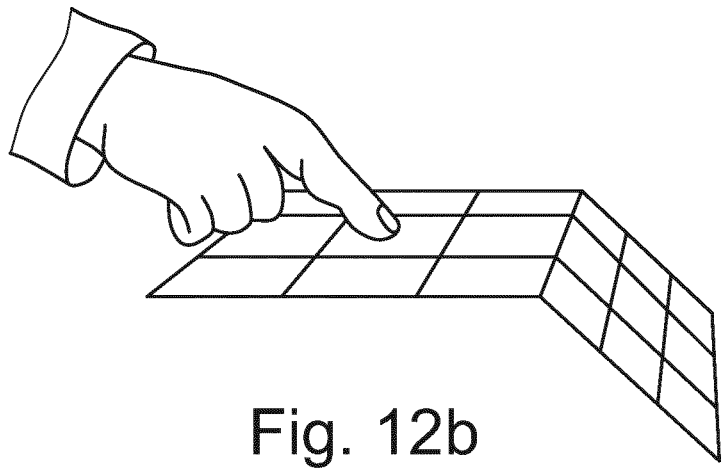

FIG. 12a shows an illustration of a sensor matrix. In other words, FIG. 12a shows a segmented representation of the surface of the interaction element and/or the touch surface element of FIG. 3, 4a-d, 5a-5d, 6c. Of course, the principle applies to any other surface geometry mutates mutandis. According to FIG. 12a, the surface is segmented into 18 rectangles addressed by columns y1 through y3 and rows x1 through x6. The segmentation might be achieved for example by a respective arrangement of first electrodes (for input) or second electrodes (for output). In FIG. 12b a finger is touching the surface within the rectangle with address (x2; y2), see FIG. 12a.

Figure 12C:
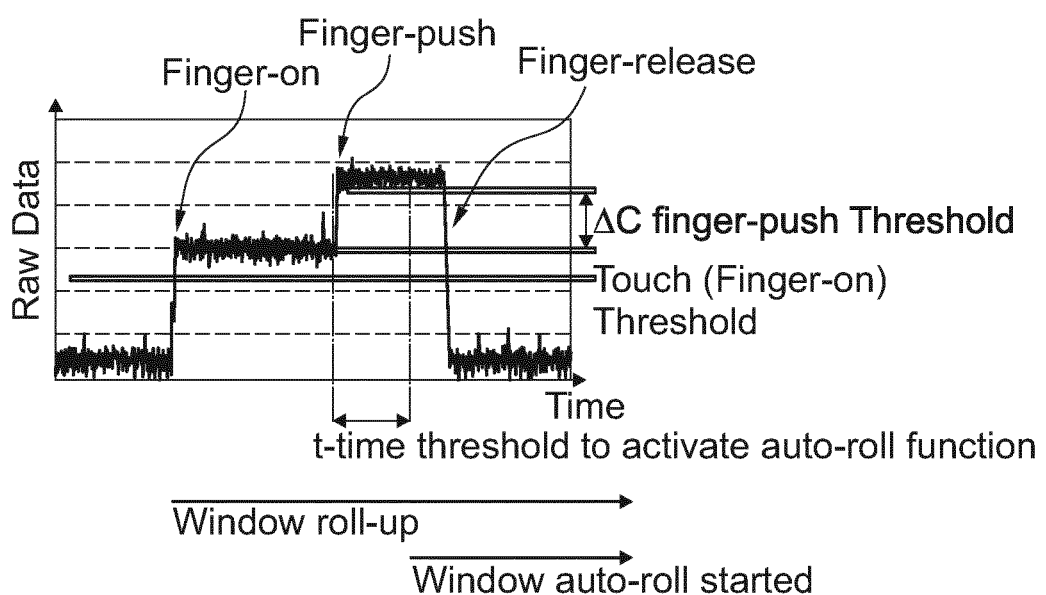

To realize the application of the interaction elements as described above, the touch controller needs to distinguish between at least/for example the "finger-on" state and the "finger-push" state. This might be possible by using an evaluation of the capacitive change ("DELTA C") value monitored during "finger-on" to detect "finger-push". FIG. 12c shows respective detection states. The content of this Figure might especially be read in conjunction with the gesture/touch event described with respect to FIGS. 4a-d and FIGS. 5a-d above.

This detection and evaluation requires preferably only a minimum touch sensor matrix (see FIG. 12a-b) and comes along with a simple implementation since e.g. a simple self-capacitive type sensor might be implemented.

Furthermore, detection and evaluation can also incorporate both, capacitive change ("DELTA C") on target sensor and relative sensor value change on neighboring sensors. In other words, if the user touches a certain area of a certain the input/output area element, also adjacent and/or neighboring input/output area elements expires a capacitive change or a touch/gesture event.

Figure 13A:
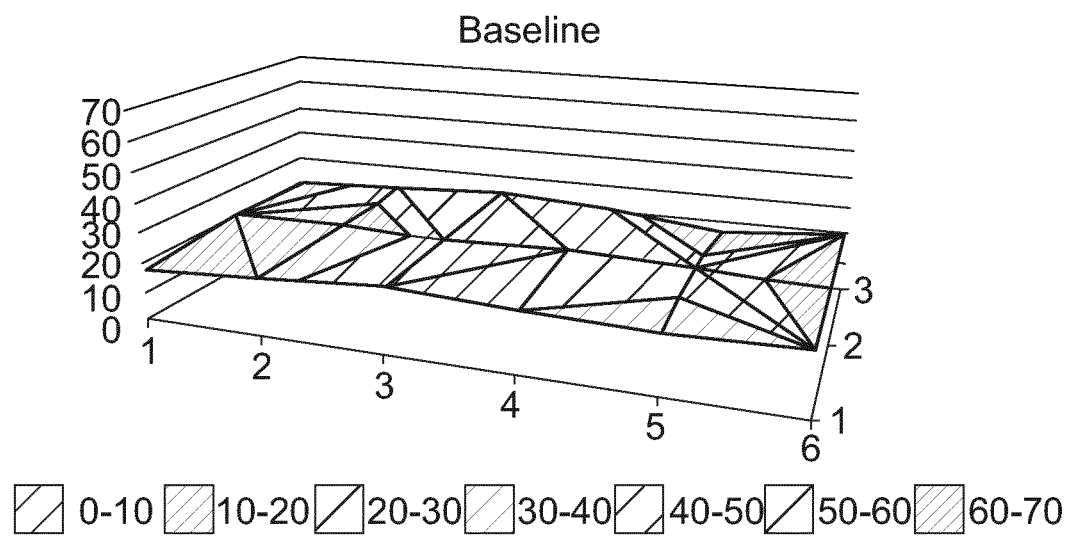
FIGS. 13a, 13b, 13c, 13d, 13e, 13f shows an illustration of detection states.
Figure 13B:
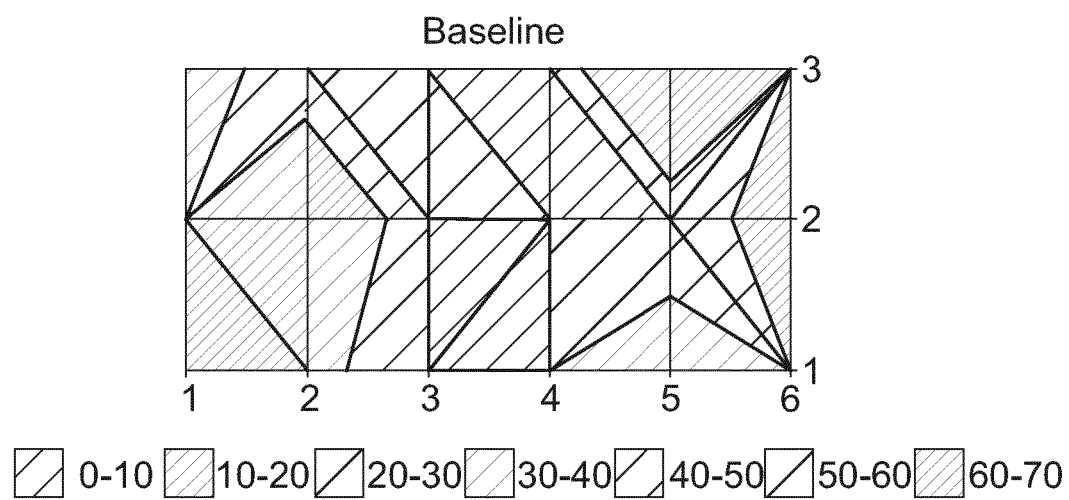
Figure 13C:
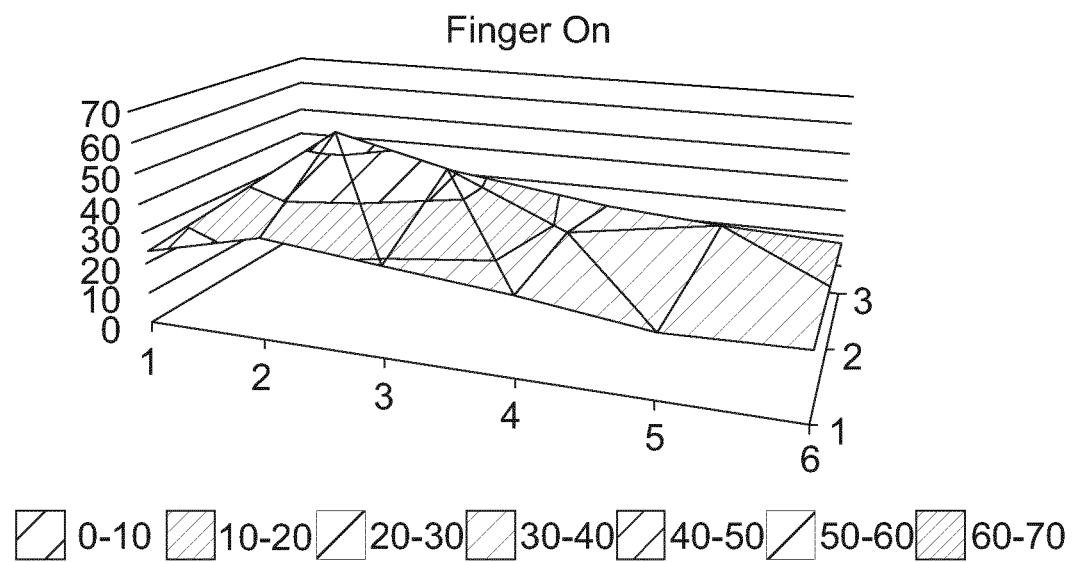
Figure 13D:
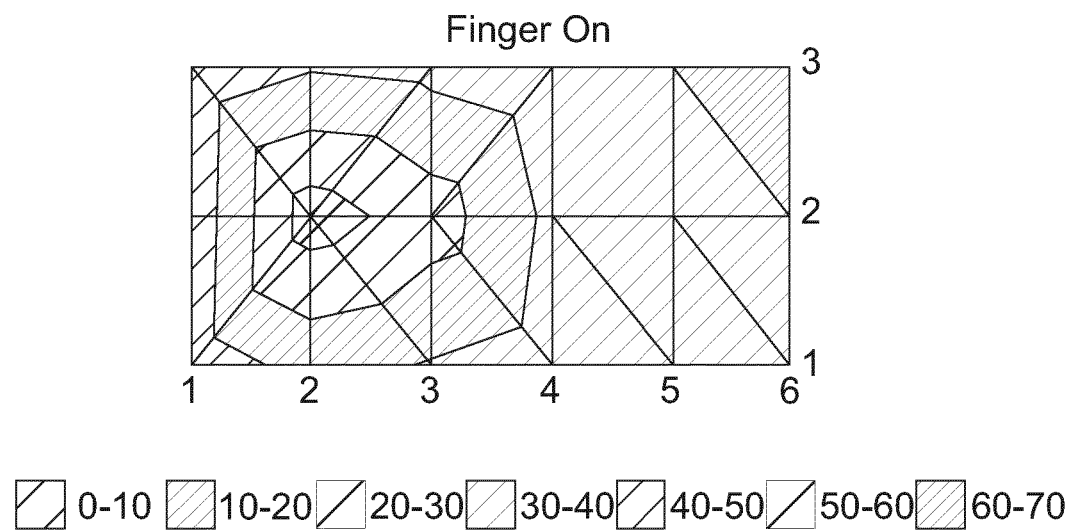
Figure 13E:
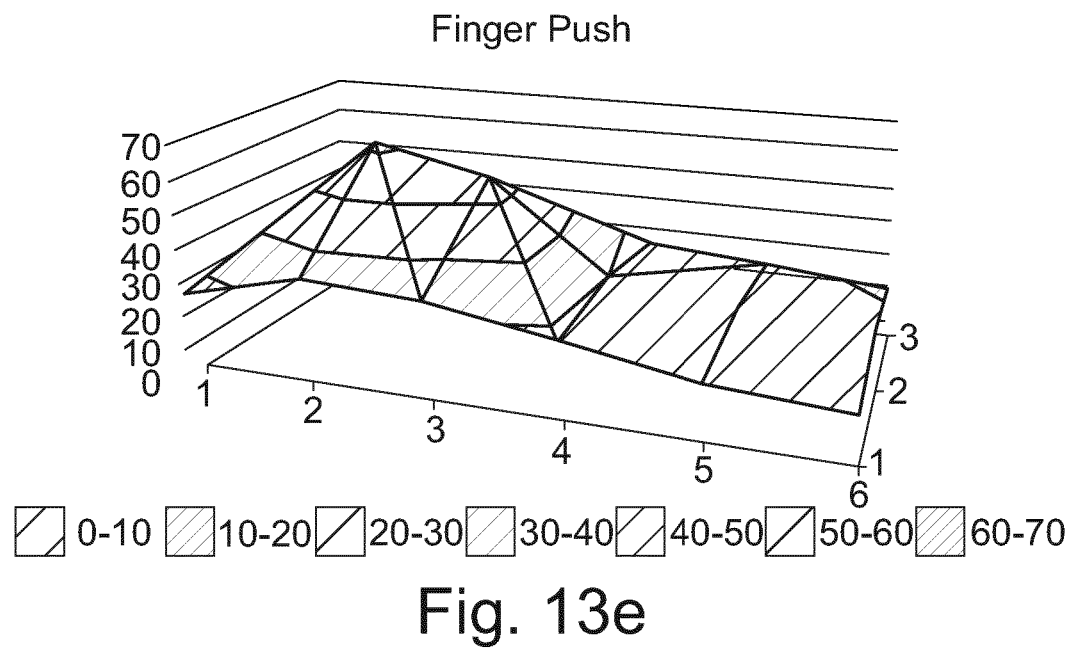
Figure 13F:
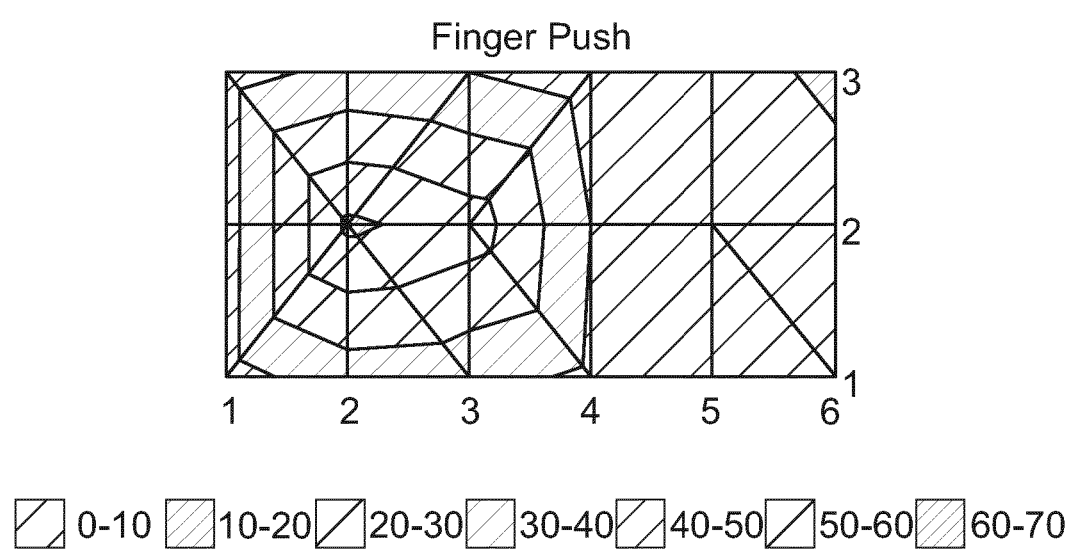

FIGS. 13a-f shows different plots of detection states of the segmented matrix of FIGS. 12a-b for "no touch" (i.e. baseline; FIGS. 13a-b), for "finger on" (FIG. 13c-d) and for "finger push" (FIGS. 13e-f) in, respectively, a perspective view and a top view. It can be taken from these plots (see FIGS. 12c-f) that there is a change on both, the peak value and the surrounding sensor values corresponding to a "finger-on" event and a "finger-push" event. The content of these plots might especially be read in conjunction with the gesture/touch event described with respect to FIGS. 4a-d and FIGS. 5a-d above.

Figure 14A:
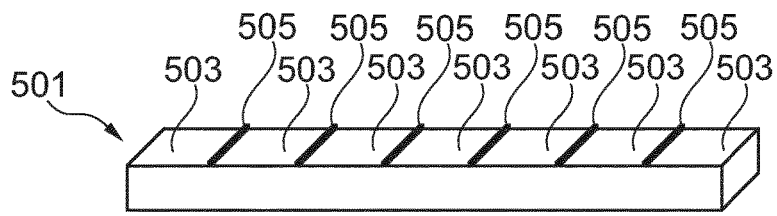
FIG. 14a Shows an illustration of an interaction element according to the first aspect of the invention in a ninth embodiment in a first variant.
Figure 14A:
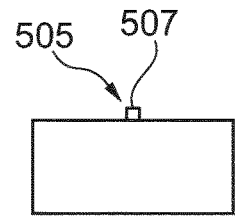

FIG. 14a shows an illustration of an interaction element 501 according to the first aspect of the invention in a ninth embodiment in a first variant. On the left side of FIG. 14a the entire interaction element 501 is shown in a perspective view. On the right side of FIG. 14a a part of the interaction element 501 is shown in a frontal view.

Interaction element 501 comprises a touch surface element having seven input area elements 503 and six output area elements 505. The output area elements 505 in turn each comprises a protrusion 507 as tactile/haptic feedback element.

Figure 14B:
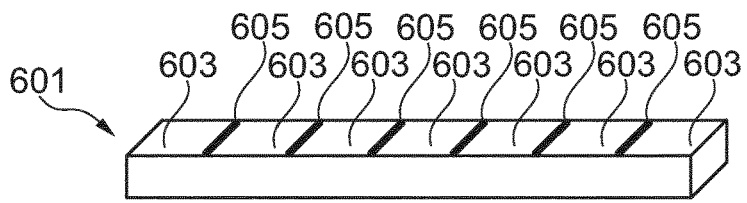
FIG. 14b Shows an illustration of an interaction element according to the first aspect of the invention in a ninth embodiment in a second variant.
Figure 14B:
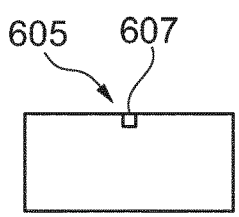

FIG. 14b shows an illustration of an interaction element 601 according to the first aspect of the invention in the ninth embodiment in a second variant. On the left side of FIG. 14b the entire interaction element 601 is shown in a perspective view. On the right side of FIG. 14b a part of the interaction element 601 is shown in a frontal view.

Interaction element 601 comprises seven input area elements 603 and six output area elements 605. The output area elements 605 in turn each comprises a recess 607 as tactile/haptic feedback element.

Of course, output area elements such as 505 and 605 are preferably feasible for static situations, i.e. where the output area elements do not move dynamically. Independent of the approach used for segments tactile feedback to the finger (i.e. mechanical approach or surface haptic approach via electrostatic or ultrasonic), both solutions may or may not use lighting segments for visual feedback in addition, too, or they may be used together.

Figure 14C:
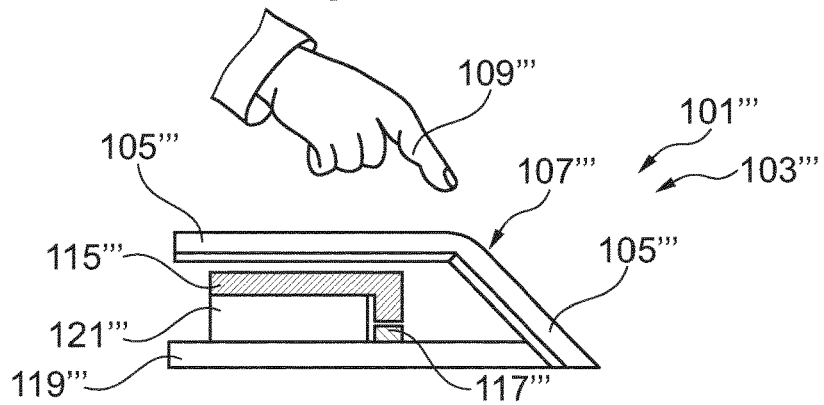
FIG. 14c Shows an illustration of an interaction element according to the first aspect of the invention in a tenth embodiment.

FIG. 14c shows an illustration of an interaction element according to the first aspect of the invention in a tenth embodiment. The interaction element shown in FIG. 14c is quite similar to the interaction element shown in FIG. 6c and described in more detail above. Therefore, features of interaction element of FIG. 14c which functionally correspond as far as possible to those of interaction element of FIG. 6c are provided with the same reference signs.

Further, due to the similarity, only differences between the two interaction elements need to be discussed. Insofar, the interaction element 101''' of FIG. 14c comprises an output area element 107''' which represents an edge. In other words, the edge which separates the two input area elements 105''' from each other represents the output area element 107'''.

Figure 1A:
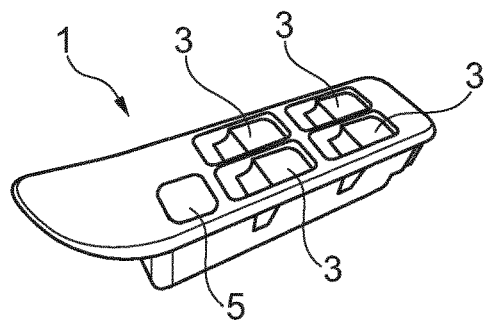
FIG. 1a shows an array of buttons according to the state of the art.
Figure 1B:
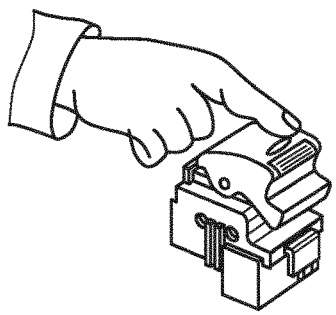
FIG. 1b shows a button according to the state of the art.
Figure 2A:
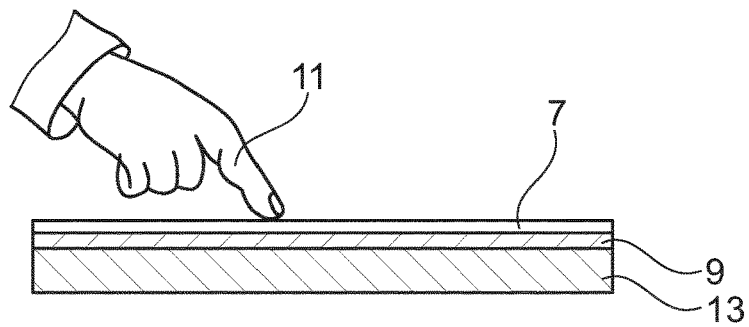
FIG. 2a shows an illustration of the first surface haptic approach.
Figure 2B:
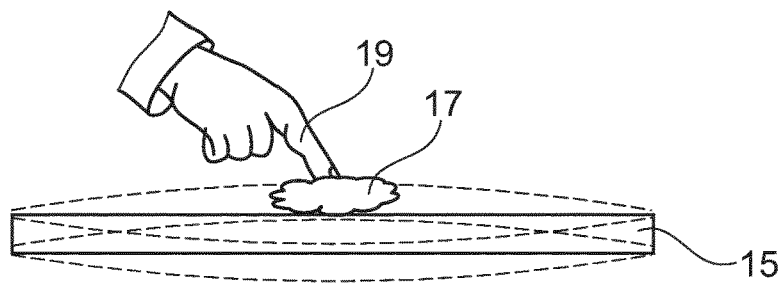
FIG. 2b shows an illustration of the second surface haptic approach.

The output area elements provide tactile feedback either by its mechanical shape, as shown in FIG. 14a, 14b, 14c or using active surface haptic such as surface electrostatic, as shown in FIGS. 7, 9 and 10, or ultrasonic, as shown in FIG. 2.

Figure 15A:
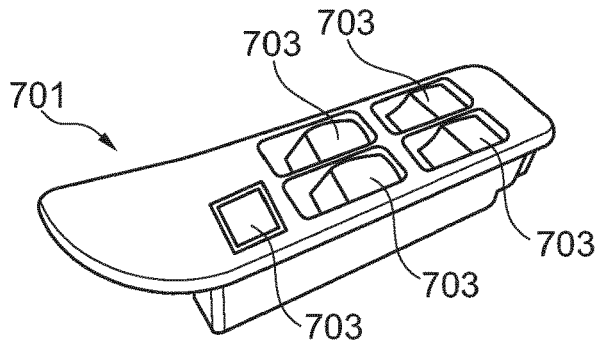
FIG. 15a shows an illustration of a control element according to the second aspect of the invention in a first embodiment.

FIG. 15a shows an illustration of a control element 701 according to the second aspect of the invention in a first embodiment. This is an example of a two-dies populated control element 701 with interaction elements 703. All interaction elements 703 are non-moving (solid state) and have touch-sensitive surfaces as described above. This interaction elements 703 can be used for the functions roll-up (swipe-bottom + back action), automatic roll-up (swipe-bottom + back and push), roll-down (swipe rear + down action), automatic roll-down (swipe rear + down and push action). In addition for lock window operation a long touch to lock is proposed.

Figure 15B:
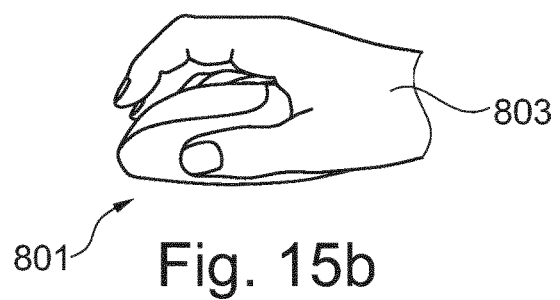
FIG. 15b shows an illustration of a control element according to the second aspect of the invention in a second embodiment.

FIG. 15b shows an illustration of a control element 801 according to the second aspect of the invention in a second embodiment. The control element 801 is a multi-sensor type which can be regarded as multifunction touch button object and which is grasped by a user's hand 803. In other words, control element 801 is a "central touch thing". This "thing" has the following optional features and advantages:

Multifunctional: same module for multiple applications (window glass movement, ventilation control, seat control and so on . . . )—selection based on touch methods.

Multilevel: Several Touch Patterns.

Blind operation: natural 3D shape, surface texture, feedback mechanism.

Feedback: vibration, tactical & haptic, audio & visual confirmation, lighting.

No Mechanical Movement.

Physical: Any shape, On surface/In-mold touch & lighting, Any surface (Hidden till lit)—(same surface as other interior).

Placement: Door panel, Seat panel, Dashboard, Center console, Hand-held remote.

Multiple variant: with/without display/lighting.

These advantages also apply mutatis mutandis optionally also to all other control elements and interaction elements described above, where appropriate.

Even if it may not be stated every times explicitly in the explanations above, it is clear that the interaction elements are especially for receiving touch and/or gesture events inputs and/or providing tactile feedback outputs, that the input area elements are adapted to receive touch and/or gesture events inputs issued by a finger when interacting with at least one part of at least one surface of the respective input area element and that the output area elements are adapted to provide a tactile feedback output to the finger when interacting with at least one part of at least one surface of the respective output area element. It is further clear that especially all control elements are for controlling the operation of at least one function of at least one device.

The features disclosed in the claims, the specification, and the drawings may be essential for different embodiments of the claimed invention, both separately or in any combination with each other.

REFERENCE SIGNS

1 Panel
3 Button
5 Button
7 Surface layer element
9 Electrode
11 Finger
13 Substrate element
15 Substrate element
17 Layer
19 Finger
101, 101', 101", 101''' Interaction element
103, 103', 103", 103''' Touch surface element
105, 105', 105", 105''' Input area element
107, 107', 107", 107''' Output area element
109, 109', 109''' Finger
111 Haptic pattern
113 Haptic pattern
115''' Light guide
117''' Light source
119''' Wire board
121''' Tactile feedback device
201 Interaction element
203 Input area element
205 Output area element
207 Electrode
209 Electrode
211 Common surface layer element
213 Area
215 Area
217 Interaction element
219 Conductors
301 Interaction element
302a Electrode
302b Common surface layer element
303 Input area element
305 Output area element
307 Area
309 Area
401 Interaction element
403 Common surface layer element
405 Electrodes
407 Light guide
409 Light source
501 Interaction element
503 Input area element
505 Output area element
507 Protrusion
601 Interaction element
603 Input area element
605 Output area element
607 Recess
701 Control element
703 Interaction element
801 Control element
803 Hand

What is claimed is:

1. An interaction element for receiving touch or gesture inputs or providing tactile feedback outputs, comprising:
at least one touch surface element, the touch surface element comprising:
at least one input area element at least adapted to receive touch or gesture inputs issued by at least one finger when interacting with at least one part of at least one surface of the input area element or the touch surface element; and
at least one output area element at least adapted to provide a tactile feedback output to the finger when interacting with at least one part of at least one surface of the output area element or the touch surface element;
wherein each output area element is configured to, using a touch controller, only provide a tactile feedback using a coulomb force to the finger when the finger is approaching the output area element and interacting with an adjacent input area element, wherein the adjacent input area element receives an input from the finger in order to provide a dynamic borderline, and
wherein the input area element and the output area element are formed as one, and wherein the interaction element comprises a segmented electrode comprising a plurality of segments, wherein each of the plurality of segments is adapted, using the touch controller, to provide an input area and an output area, wherein a surface friction of the at least one touch surface element is increased based on the coulomb force, wherein the dynamic borderline moves from one of the plurality of segments to a separate segment based on a sliding direction of the finger, wherein the input and output areas can be interchangeably controlled by the touch controller, and wherein each of the segmented electrodes can be configured for use as both an input area element and an output area element dependent on a configuration of the interaction element, wherein the input area element and the output area element are configured to interchange electronically without physical reconfiguration.

2. The interaction element according to claim 1, wherein the interaction element comprises a first plurality of input area elements and a second plurality of output area elements, wherein at least two neighboring input area elements or all of each two neighboring input area elements are at least in certain areas or at least partly separated by each other by at least one of the second plurality of output area elements.

3. The interaction element according to claim 1, wherein the input area element, comprises one or more of:
   at least one first surface layer element or the first surface layer element comprises or represents at least one insulator layer;
   at least one first electrode; and
   at least one first substrate element which comprises at least one glass substrate,
   wherein the first electrode is arranged directly or indirectly below the first surface layer element or the first substrate element is arranged directly or indirectly below the first electrode element, and
   the respective elements are sandwich-like arranged with the first electrode being arranged at least in certain areas or at least partly between the first surface layer element and the first substrate element, the first electrode is arranged directly or indirectly below the first surface layer element or the first substrate element is arranged directly or indirectly below the first electrode element.

4. The interaction element according to claim 1, wherein the output area element comprises one or more of:
   at least one second surface layer element or the second surface layer element comprises or represents at least one insulator layer;
   at least one second electrode; and
   at least one second substrate element which comprises at least one glass substrate,
   wherein the second electrode is arranged directly or indirectly below the second surface layer element or the second substrate element is arranged directly or indirectly below the second electrode element, and
   the respective elements are sandwich-like arranged, with the second electrode being arranged at least in certain areas or at least partly between the second surface layer element and the second substrate element.

5. The interaction element according to claim 1, wherein the tactile feedback
   represents a haptic pattern dependent on the gesture or touch input; or
   comprises increasing the surface friction of at least one portion of at least one surface of the output area element or of the second surface layer element when applying a voltage to at least one part of the output area element or to the second electrode.

6. The interaction element according to claim 1, wherein the output area element comprises at least one ultrasonic actuator, especially a plurality of ultrasonic actuators, coupled to or in operative connection to the second substrate element, the second electrode or the second surface layer element for building an air bearing layer adjacent to at least one portion of at least one surface of the output area element of the second substrate element or second surface layer element, when the one or more ultrasonic actuator is activated.

7. The interaction element according to claim 1, wherein the first or second surface layer element comprises at least one conductor or a plurality of conductors for capacitive coupling, the at least one conductor being arranged at least in sections or at least partly (a) within the second surface layer element, (b) parallel to at least one surface, a top surface, or a bottom surface of the second surface layer element, or (c) parallel to each other.

8. The interaction element according to claim 1, wherein
   at least some of the first or second surface layer elements, or all of the first or second surface layer elements, are formed as one common surface layer element,
   at least some of the first or second substrate elements, or all of the first or second substrate elements, are formed as one common substrate element, or
   at least some of the first or second electrodes, or all of the first or second electrodes, are formed as one common electrode or as at least one segmented electrode.

9. The interaction element according to claim 1, wherein the output area element or the second surface layer element, comprises or represents at least one edge, at least one bump, at least one protrusion, at least one recess, or at least one detent, wherein the output area element, the second surface layer element, is configured to be manufactured using at least one of a printing process, an injection molding process, a heat forming process, or a grinding process.

10. The interaction element according to claim 1, wherein at least one or all output area elements are configured, using at least one touch controller, to interchangeably or simultaneously be adapted to receive touch or gesture events issued by at least one finger when interacting with at least one part of at least one surface of the output area element or the touch surface element by interchanging use of the second electrode as the first electrode.

11. The interaction element according to claim 1, wherein the interaction element further comprises at least one light guide for illuminating through the input area element or output area element from beneath, the light guide being arranged or extending at least in sections or in certain areas directly or indirectly below, parallel to the first or second electrode, below, or parallel to the first or second substrate element.

12. The interaction element according to claim 1, wherein the interaction element further comprises
   at least one light source adapted for coupling light into a light guide,
   at least one printed wire board, the light source or at least one element of the group comprising first/second surface layer element, first/second electrode and first/second substrate element being mounted at least partly on the printed wire board, or
   at least one tactile feedback device for generating a tactile feedback to the user interacting with the interaction element.

13. The interaction element according to claim 1, wherein the interaction element or the touch surface element is designed as a free form element.

14. The interaction element according to claim 13, wherein the interaction element has at least in certain areas a curved surface or at least one first area extending in at least one first plane and at least one second area extending in at least one second plane.

15. The interaction element according to claim 14, wherein the second plane is angled with respect to the first plane at an angle of between 115° an 155°.

16. The interaction element according to claim 1, wherein the input area element is designed so that a touch state can be detected and so that at least a finger-on state is distinguished from a finger-push state, using at least one of:
- evaluation of the capacitive change value of the input area element selected by a user during interaction of the user's finger and said input area element, or
- evaluation of the capacitive change value of input area elements adjacent or neighboring to the selected input area element during interaction of the user's finger and the selected input area element and the input area elements adjacent or neighboring to said input area element.

17. A control element for controlling operation of at least one function of at least one device, comprising at least one or more, different interaction elements of claim 1.

18. A motor vehicle, comprising:
- at least one or more different interaction elements of claim 1; and
- at least one or more different control element for controlling operation of the one or more different interaction elements.

* * * * *